United States Patent
Kohno (10) Patent No.: US 6,679,997 B2
(45) Date of Patent: Jan. 20, 2004

(54) ORGANIC INSULATION FILM FORMATION METHOD

(75) Inventor: Michihisa Kohno, Tokyo (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 110 days.

(21) Appl. No.: 09/371,624

(22) Filed: Aug. 11, 1999

(65) Prior Publication Data

US 2003/0132194 A1 Jul. 17, 2003

(30) Foreign Application Priority Data

Aug. 12, 1998 (JP) .......................................... 10-227964

(51) Int. Cl.[7] ................................................ B44C 1/22
(52) U.S. Cl. ............................ 216/41; 216/47; 216/51; 216/58; 216/66; 216/67; 438/700; 438/706
(58) Field of Search .............................. 216/41, 47, 51, 216/58, 66, 67; 438/700, 706

(56) References Cited

U.S. PATENT DOCUMENTS

| | | | | |
|---|---|---|---|---|
| 4,495,090 A | * | 1/1985 | Horwitz | 216/67 |
| 5,053,105 A | * | 10/1991 | Fox, III | 216/51 |
| 5,254,480 A | * | 10/1993 | Tran | 250/370.09 |
| 5,298,445 A | * | 3/1994 | Asano | 437/40 |
| 5,572,072 A | * | 11/1996 | Lee | 257/751 |
| 5,945,007 A | * | 8/1999 | Cohen | 216/22 |
| 6,038,008 A | * | 3/2000 | Kim et al. | 349/138 |
| 6,080,529 A | * | 6/2000 | Ye et al. | 430/318 |
| 6,277,762 B1 | * | 8/2001 | Hwang | 438/714 |
| 6,338,994 B1 | * | 1/2002 | Torii et al. | 438/238 |
| 6,452,276 B1 | * | 9/2002 | Cohen et al. | 257/763 |

FOREIGN PATENT DOCUMENTS

| | | | | |
|---|---|---|---|---|
| JP | SHO 51-92176 | 2/1975 | | |
| JP | 51-92176 | 8/1976 | | |
| JP | SHO 58-114433 | 7/1983 | | |
| JP | 58-114433 | 7/1983 | | |
| JP | SHO 62-186534 | 8/1987 | | |
| JP | SHO 62-195125 | 8/1987 | | |
| JP | HEI 1-236681 | 9/1989 | | |
| JP | HEI 4-44226 | 2/1992 | ......... | H01L/21/302 |
| JP | 4-44226 | * 2/1992 | ......... | H01L/21/302 |
| JP | 9-25561 | * 1/1997 | ......... | H01L/21/285 |
| JP | HEI 9-55429 | 2/1997 | | |
| JP | 9-55429 | 2/1997 | | |

OTHER PUBLICATIONS

Wolf et al, "silicon Processing for the VLSI Era" vol.1–Process Technology, 1986, pp. 546–547.*

* cited by examiner

Primary Examiner—Nadine G. Norton
Assistant Examiner—Shamim Ahmed
(74) Attorney, Agent, or Firm—Choate, Hall & Stewart (57) ABSTRACT

The present invention enables reduction of a film thickness of a protection film so as to eliminate destruction caused by stress of the protection film; to increase a film thickness of an organic insulation film so as to exhibit the function of the organic insulation film sufficiently; and to reduce irregularities of the protection film thickness. In the organic insulation film 18 formation method according to the present invention, an organic insulation film 18, a protection film 20, and a metal film are successively formed in this order on a substrate 10. On the metal film, a patterned photo-resist is formed so as to be used as a mask for etching the metal film. The remaining metal film is used as a mask when etching the protection film 20 and the organic insulation film 18. The protection film 20 can significantly reduce its thickness because the protection film 20 need not be used as a mask. The organic insulation film 18 can be set to an arbitrary thickness regardless of the protection film 20.

34 Claims, 8 Drawing Sheets

ORGANIC INSULATION FILM FORMATION METHOD

BACKGROUND OF THE INVENTION

1. Field of the Invention

The present invention relates to an organic insulation film used as an insulation film between layers and in particular, to an organic insulation film formation for reducing the wiring parasite capacity.

2. Description of the Related Art

Figure 1:
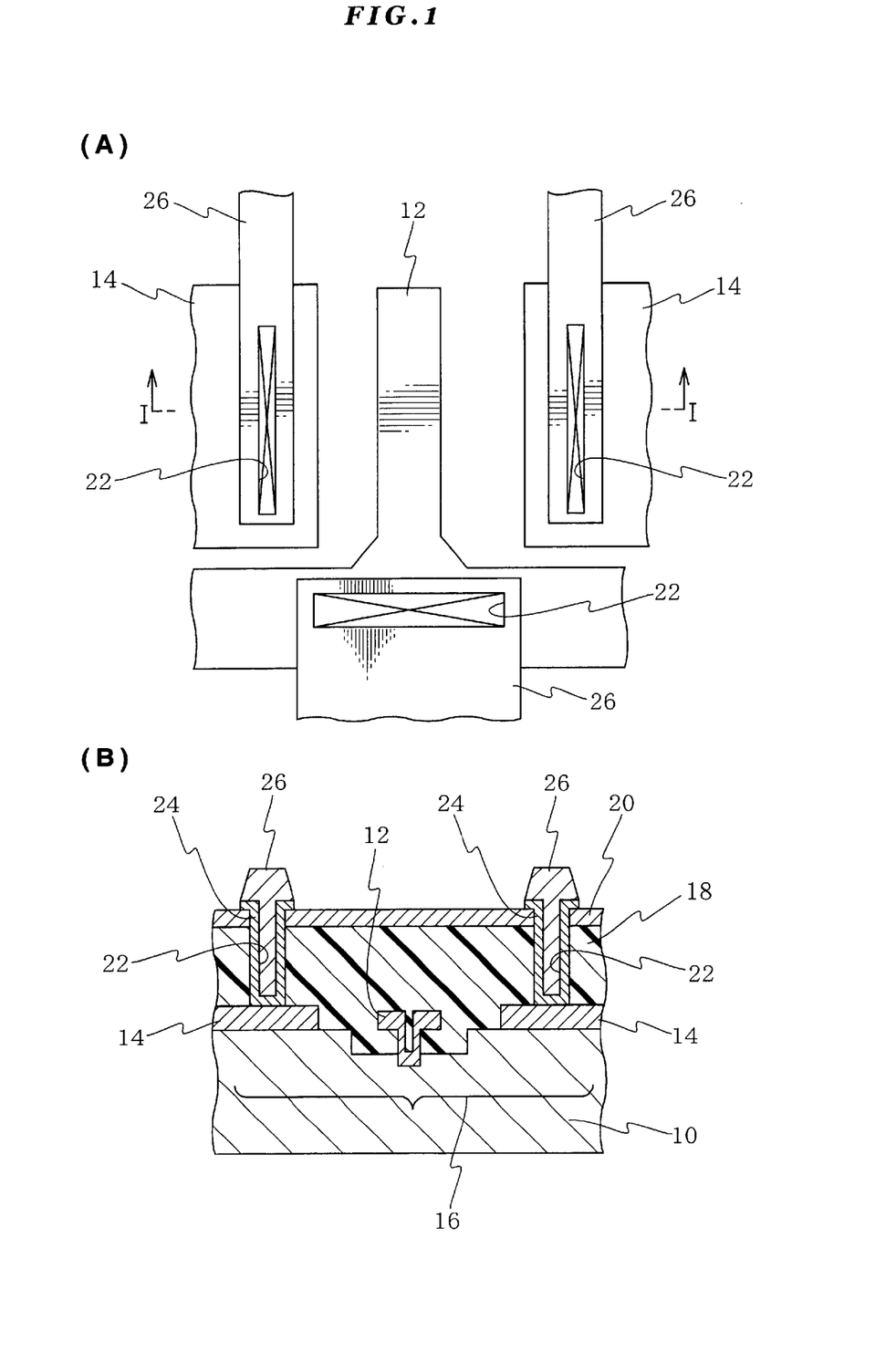
FIG. 1 shows a GaAs FET produced using an organic insulation film formation method according to the present invention.

For example, in a GaAs FET (field-effect transistor), it is necessary to reduce the parasite capacity of a gate electrode. For this, as an insulation film covering a T type gate electrode, instead of the conventional $Si_3N_4$ (having a specific dielectric constant 7.0) and $SiO_2$ (having a specific dielectric constant 4.0), as shown in FIG. 1, there is a tendency to use an organic insulation film such as benzocyclobutene having a very small specific dielectric constant 2.7.

Moreover, in order to reduce electric interference between wires, such an organic insulation film has begun to be used also for inter-layer insulation in a multi-layered wiring. Moreover, the organic insulation film such as benzocyclobutene has an advantage that a liquid of benzocyclobutene having a low viscosity can easily be applied through rotation and sintered to form a film to obtain a flat surface. Accordingly, this material is also applied to an inter-layer insulation film of a hetero-bipolar transistor as a vertical (non-lateral) device having a number of convex and concave portions.

Conventionally, for etching an organic insulation film, a protection film on the organic insulation film has been used as a mask. For example, in order to obtain an opening (hole) in the benzocyclobutene film, a corresponding hole is made in the protection film made from $Si_3N_4$ or $SiO_2$ so as to serve as a mask when subjected to a reactive ion etching using a mixed gas plasma of oxygen and fluorine for dry processing.

However, the conventional organic insulation film formation method has such a problem that if the protection film thickness is increased to obtain a sufficient mask function, the organic insulation film is deteriorated. The organic insulation film should have a small thickness so that sufficient etching can be obtained even with a thin protection film.

For example, a combination of benzocyclobutene as an organic insulation film and $Si_3N_4$ or $SiO_2$ as a protection film (serving also as a mask) shows etching ratio as small as 10:1. That is, when the organic insulation film is etched by 10, the protection film is etched by 1. Accordingly, the film thickness of $Si_3N_4$ or $SiO_2$ should have a thickness in the order of ⅕ of the benzocyclobutene film.

More specifically, if the benzocyclobutene film has a thickness of 2 micrometers, the $Si_3N_4$ or $SiO_2$ film should have a thickness equal to or more than 0.4 micrometers.

On the other hand, when forming a $Si_3N_4$ or $SiO_2$ film on the benzocyclobutene, film stress may cause cracks in the benzocyclobutene film. Especially when the $Si_3N_4$ or $SiO_2$ film has a thickness equal to or more than 3000 Angstrom, the cracks or other deterioration of benzocylobutene are remarkably increased. For this, the benzocyclobutene has been restricted to about 1 micrometer.

Moreover, the mask materials $Si_3N_4$ and the $SiO_2$ are also etched by a significant etching rate and it is difficult to control a remaining film thickness of $Si_3N_4$ and $SiO_2$. The remaining film thickness $Si_3N_4$ or the $SiO_2$ varies significant, which in turn brings about a problem of irregularity of the specific dielectric constant.

SUMMARY OF THE INVENTION

It is therefore an object of the present invention to provide an organic insulation film formation method characterized in the following three points. (1) By reducing the film thickness of the protection film, cracks and other deterioration of the organic insulation film is eliminated. (2) The thickness of the organic insulation film is increased so as to exhibit a sufficient function of the organic insulation film. (3) Irregularities of the thickness of the protection film is reduced.

The present invention provides an organic insulation film formation method comprising: a step of successively forming an organic insulation film, a protection film, and a metal film in this order on a substrate; a step of forming a patterned photo-resist on the metal film; a step of etching the metal film using the photo-resist as a mask; and a step of etching the protection film and the organic insulation film using the remaining metal film as a mask.

In the conventional technique, the protection film is used as a mask and needs to have a sufficient thickness for serving as a mask. In contrast to this, the present invention uses as a mask the metal film on the protection film. Accordingly, the protection film can have a significantly reduced thickness.

In the conventional technique, the organic insulation film should have a film thickness appropriate for the protection film used as a mask. In contrast to this, the organic insulation film can have a thickness regardless of the protection film because the metal film on the protection film is used as a mask. That is, the present invention enables to obtain an organic insulation film having a sufficient thickness.

In the present invention, the metal film is used as a mask for etching the protection film and the organic insulation film. Accordingly, the irregularities of the protection film thickness can be reduced in comparison to the conventional technique in which the protection film is used as a mask for etching the organic insulation film.

When etching the protection film and the organic insulation film using the metal mask as the film, the etching rate of the metal film is preferably equal to or below ¹⁄₁₀ of the etching rate of the protection film and the organic insulation film. The organic insulation film is made from, for example, benzocyclobutene (BCB). The protection film is made from, for example, a silicon compound, silicon nitride, silicon oxide, and the like. The metal film is made from, for example, platinum or gold or an alloy containing at least one of platinum and gold.

In other words, the present invention is characterized in that when the organic insulation film is subjected to dry etching, the etching mask is realized by a three-layer configuration constituted by a platinum (Pt) or gold (Au) film, a titanium (Ti) film, and a silicon nitride ($Si_3N_4$) or silicon oxide ($SiO_2$) film. This enables to realize a dry etching having a wide selection range and to maintain the film thickness of $Si_3N_4$ or $SiO_2$ when formed.

The platinum (Pt) film has a significantly low etching rate for dry etching using a mixed gas plasma of oxygen and fluorine. The etching rate of Pt is smaller than etching rate of the $Si_3N_4$ etching rate by several tens and smaller than the etching rate of the organic insulation film etching by several hundreds. Accordingly, the Pt film can serve as an etching mask for the $Si_3N_4$ film and the organic insulation film.

Moreover, the $Si_3N_4$ film serves as a protection film for the organic insulation film, and is not be etched when making an opening in the organic insulation film. Thus, it is easy to control the final film thickness.

The aforementioned effects can also be obtained when the Pt is replaced by Au, and the $Si_3N_4$ is replaced by $SiO_2$.

BRIEF DESCRIPTION OF THE DRAWINGS

FIG. 1A is a plan view of the GaAs FET partially omitted, and FIG. 1B is a cross sectional view about the line I—I in FIG. 1A.

DESCRIPTION OF THE PREFERRED EMBODIMENTS

FIG. 1 shows a GaAs FET produced using an organic insulation film formation method according to the present invention. FIG. 1A is a plan view of the GaAs FET partially omitted, and FIG. 1B is a cross sectional view about the line I—I in FIG. 1A.

On the substrate 10 made from n type GaAs, a FET 16 is formed by a gate electrode 12 and an ohmic electrode 14 as a source electrode and a drain electrode. On the FET 16 is formed an organic insulation film 18 made from benzocyclobutene. This organic insulation film 18 is covered with a protection film 20 made from $Si_3N_4$. The protection film 20 protects the organic insulation film 18 from penetration of moisture. The organic insulation film 18 has a through hole 22. On the wall of the through hole of the organic insulation film with a bottom of ohmic electrode, films of titanium (T), platinum (Pt) and gold (Au) are formed in this order. This composite film of Ti—Pt—Au is used as a plating path to form a wiring 26.

The benzocyclobutene has a specific dielectric constant about $\in=2.7$ which is remarkably small compared to the $SiO_2$ ($\in=4.0$) and $Si_3N_4$ ($\in=7.0$). Accordingly, the wiring 26 on the organic insulation film 18 as the inter-layer insulation film has a sufficiently small parasite capacity.

FIG. 2 to FIG. 6 are cross sectional views showing a organic insulation film forming method according to a first embodiment of the present invention. This embodiment is applied to the GaAs FET formation method of FIG. 1. Hereinafter, explanation will be given with reference to FIG. 2 to FIG. 6. Note that like components as FIG. 1 are denoted by like reference symbols and their explanations are omitted.

Firstly, as shown in FIG. 2A, on the substrate 10 are formed a Ni (500 Angstrom) film, a AuGe (2000 Angstrom) film, and a Au (500) Angstrom) film are formed in this order. Then, an ohmic electrode 14 is formed by a thermal processing for 1 minute at 400 [DEGREES CENTIGTADE] in a hydrogen atmosphere. Subsequently, on the ohmic electrode 14 is formed a benzocyclobutene film having a thickness of 2 micrometers, thus forming the organic insulation layer 18. Benzocyclobutene in a liquid state is applied by a rotary painting apparatus and sintered by thermal processing of 300 [DEGREES CENTIGTADE] for 20 minutes in a nytrogen atmosphere. When the rotary painting is complete, flattening is complete.

Next, as shown in FIG. 2B, on the organic insulation film 18, a protection film 20 is formed by applying silicon nitride ($Si_3N_4$) to have a thickness of 2000 Angstrom using the plasma CVD method. The film formation temperature is 300 DEGREES CENTIGRADE. The $Si_3N_4$ protects the benzocyclobutene from change of specific dielectric constant due to penetration of moisture.

Subsequntly, as shown in FIG. 2C, on the protection film 20, a Ti film 281 (100 Angstrom) and a Pt film 282 (200 Angstrom) are successively formed in this order by way of sputtering, thus forming a metal film 28. Because the Ti is easily adhered to the $Si_3N_4$ and Pt, the Pt film can easily be adhered sufficiently.

Subsequently, as shown in FIG. 3D, photo-resist is painted onto the metal film 28. After this, an opening 32 is patterned by the lithography technique.

Subsequently, as shown in FIG. 3E, a portion of the metal film at the opening is removed by way of ion milling. Here, it is allowed that the protection film 20 is over-etched, but the etching amount is preferably as small as possible.

Subsequently, as shown in FIG. 4F, the photo-resist is removed by using an oxygen plasma or chloride for peeling off the photo-resist. Here, the organic insulation film 18 (benzocyclobutene) has a low resistance against the oxygen plasma and the photo-resist peeling chloride. However, there is no danger of erosion because the organic insulation film 18 is covered with the protection film 20 ($Si_3N_4$).

Subsequently, as shown in FIG. 4G, using the Pt film 282 as an etching mask, the reactive ion etching method is applied for processing the protection film 20 and the organic insulation film 18. In this step, the through hole 22 is formed. The etching gas is a mixture of oxygen (20 SCMM) and $CF_4$ (5 SCCM). The plasma pressure is set to 10 mTorr for performing etching. The etching selection ratio of the Pt and $Si_3N_4$ is as high as serveral tens. The etching selection ratio of the Pt and the benzocyclobutene is as high as several hundreds. Accordingly, the $Si_3N_4$ and bezocyclobutene processing can be completed almost without etching of Pt.

Subsequently, as shown in FIG. 5H, a Ti film (500 Angstrom) 241, a Pt film (500 Angstrom) 242, and a Au film (1000 Angstrom) 243 are successively formed in this order by way of sputtering, thus completing the plating path 24.

Subsequently, as shown in FIG. 5I, a photo-resist 34 is applied for patterning for plating, and then Au plating is performed to form the wiring 26.

Subsequently, as shown in FIG. 6J, the photo-resist 34 is removed by using an organic solvent such as methyl ethyl ketone.

At last, as shown in FIG. 6K, ion milling is performed to remove an unnecessary plating path 24 and to expose the protection film 20.

Figure 7:
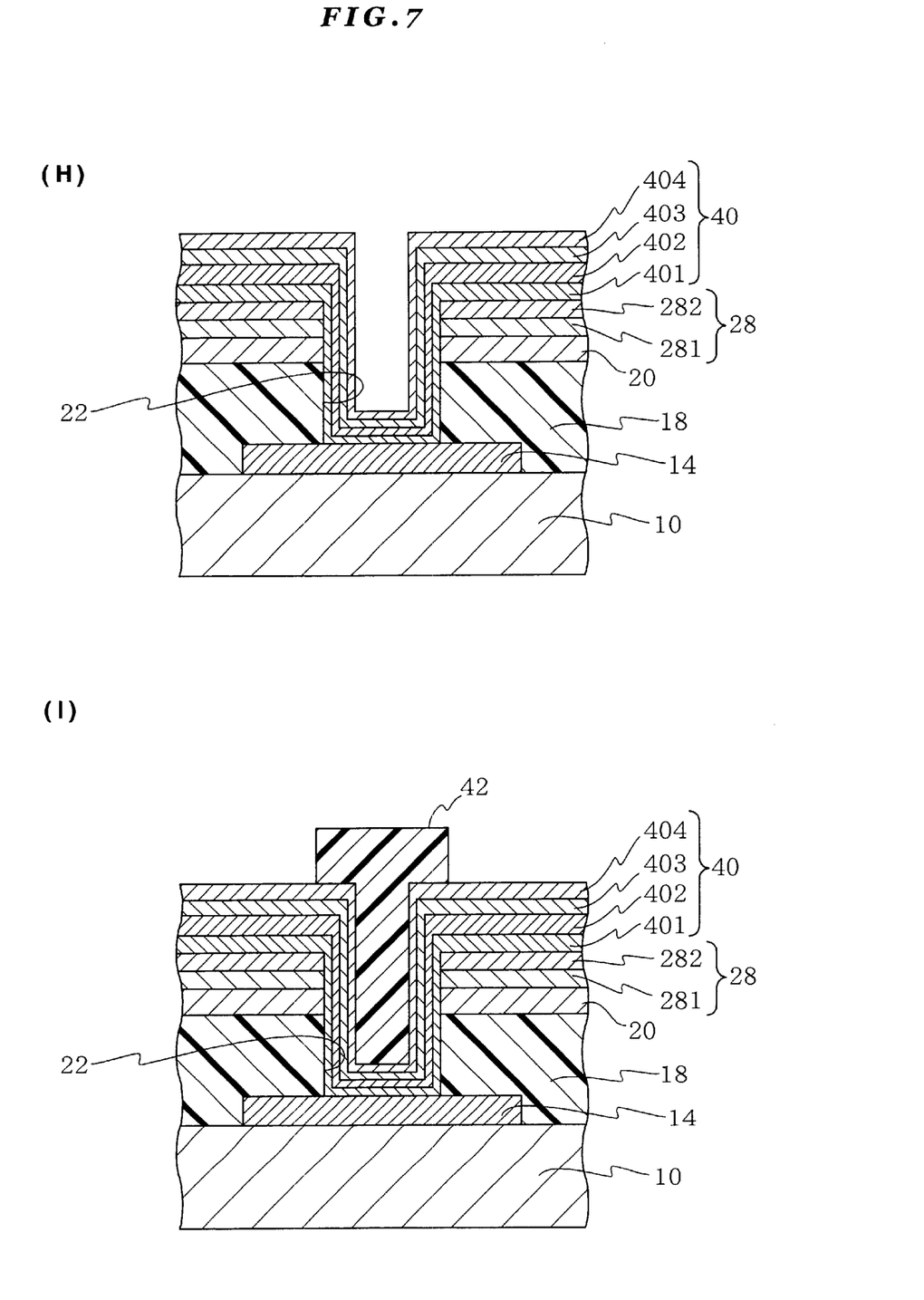
FIG. 7H and FIG. 7I are cross sectional views of film formation steps in this order for forming an organic insulation film according to a second embodiment of the present invention.
Figure 8:
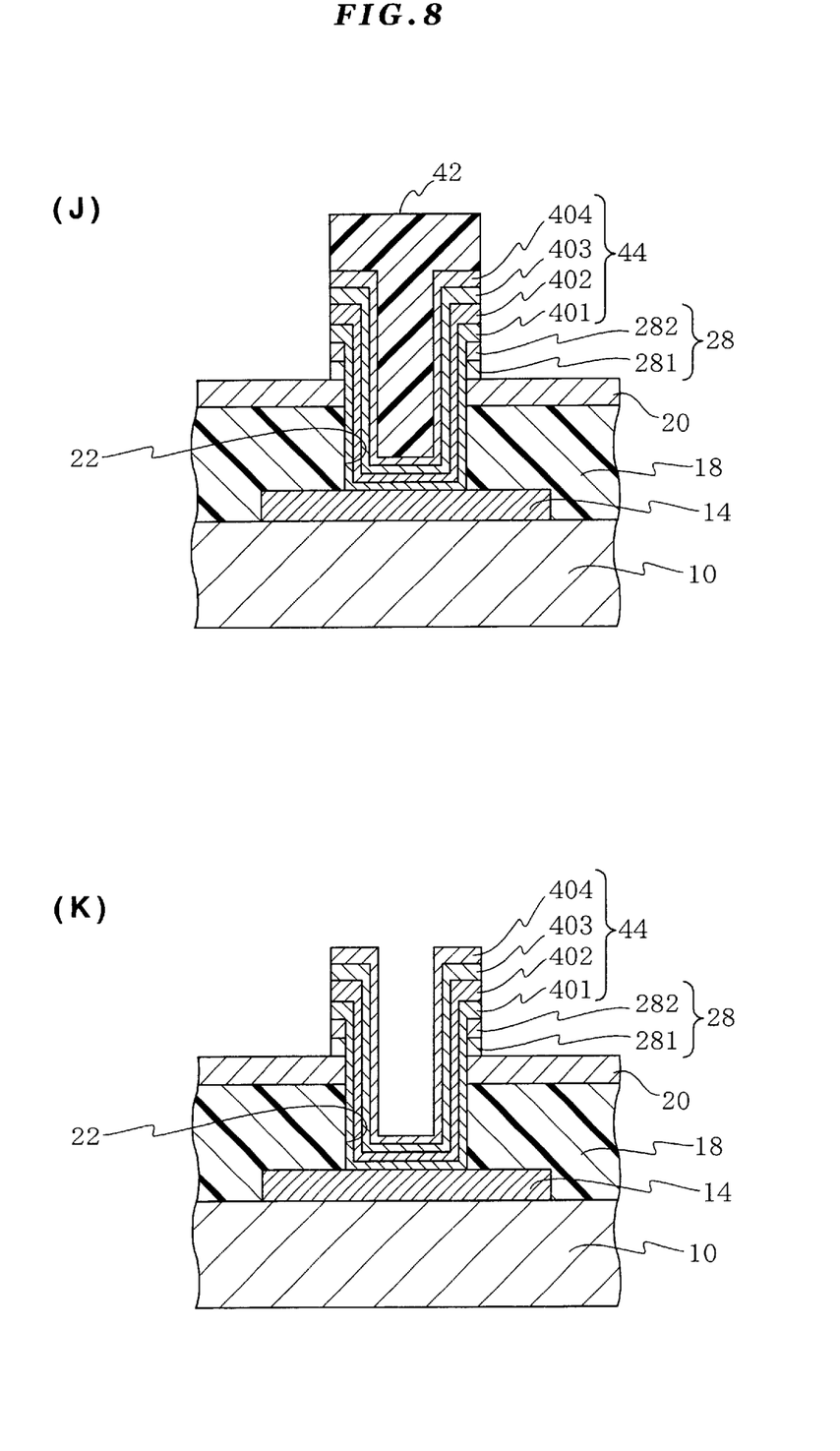
FIG. 8J and FIG. 8K are cross sectional views of film formation steps in this order for forming the organic insulation film according to the second embodiment of the present invention.

FIG. 7 and FIG. 8 are cross sectional views associated with the organic insulation film formation method according to a second embodiment of the present invention. This embodiment is applied to a multi-layered wiring. Hereinafter explanation will be given with reference to FIG. 7 and FIG. 8. Note that like components are denoted by like reference symbols and their explanations are omitted.

Figure 2:
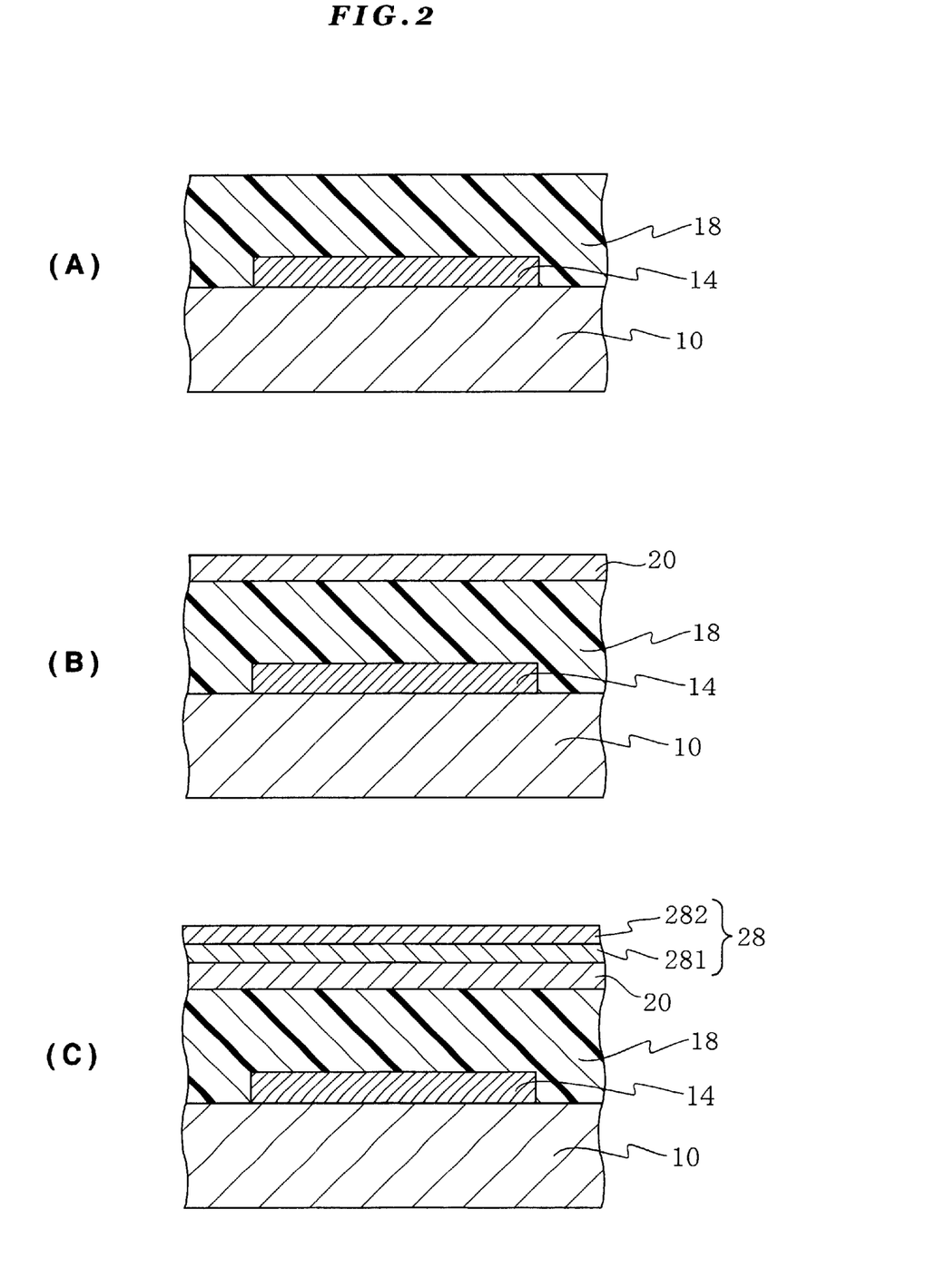
FIG. 2A, FIG. 2B, FIG. 2C are cross sectional views of film formation steps in this order for forming an organic insulation film according to a first embodiment of the present invention.
Figure 3:
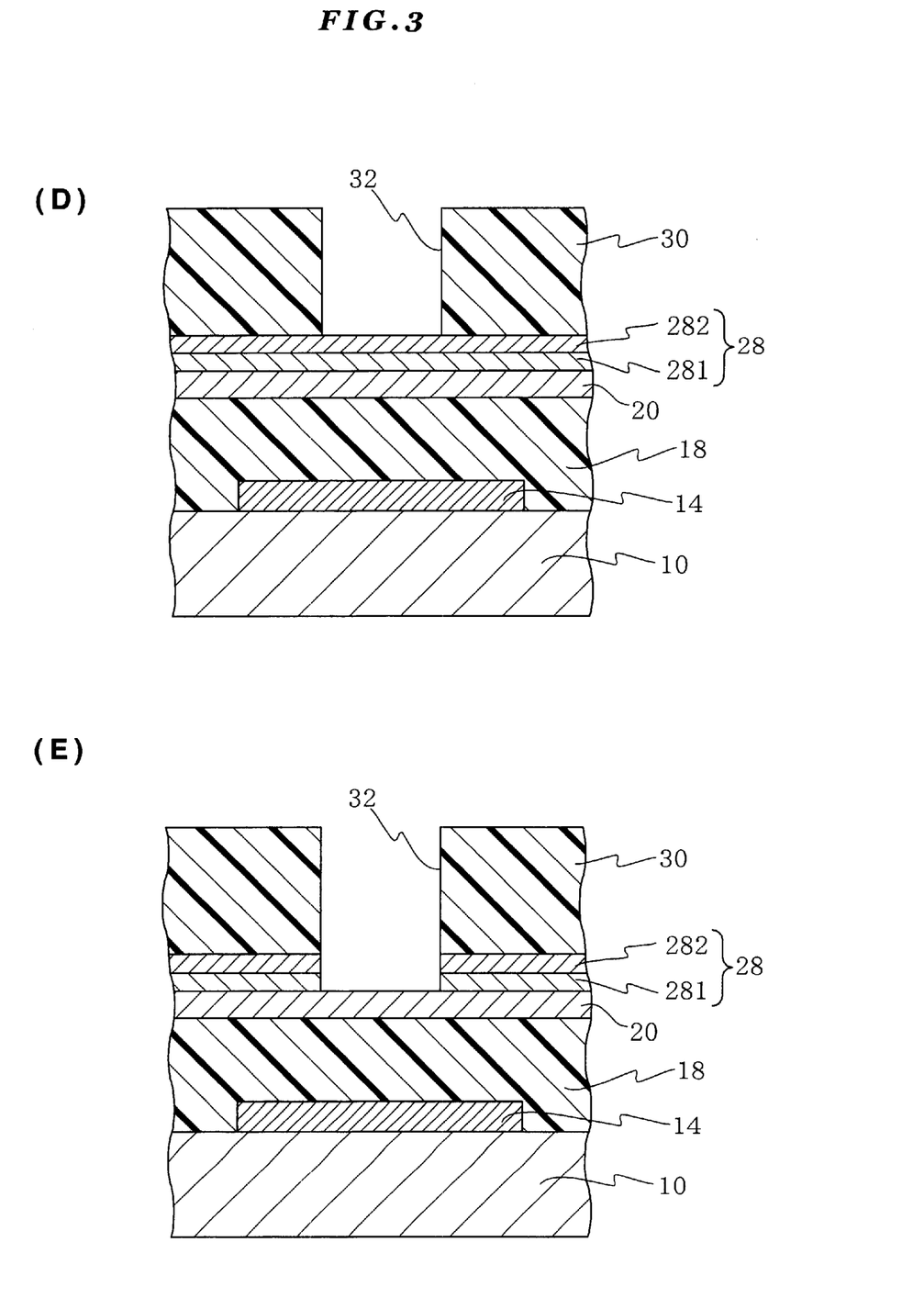
FIG. 3D and FIG. 3E are cross sectional views of film formation steps in this order for forming the organic insulation film according to the first embodiment of the present invention.
Figure 4:
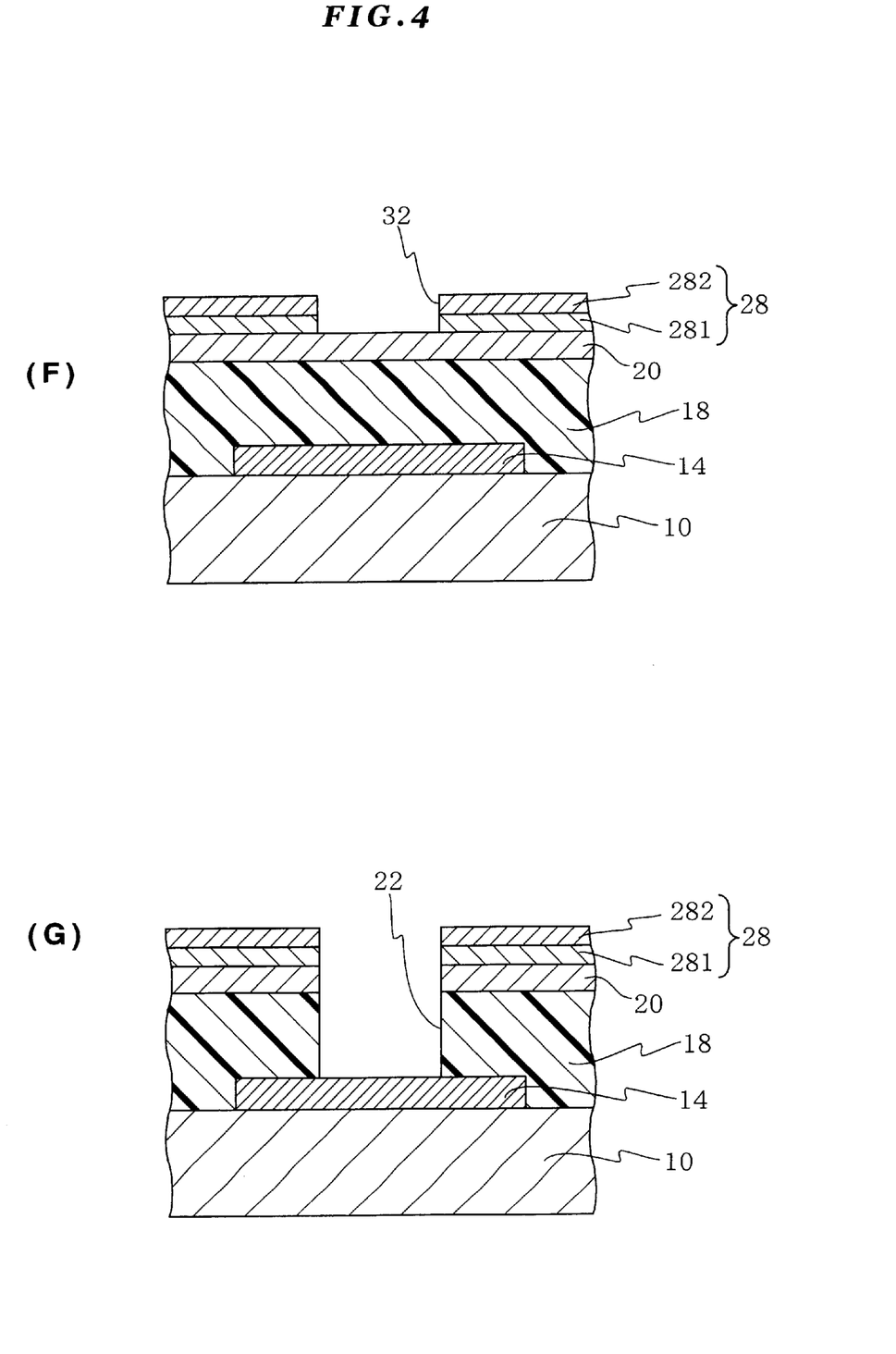
FIG. 4F and FIG. 4G are cross sectional views of film formation steps in this order for forming the organic insulation film according to the first embodiment of the present invention.
Figure 5:
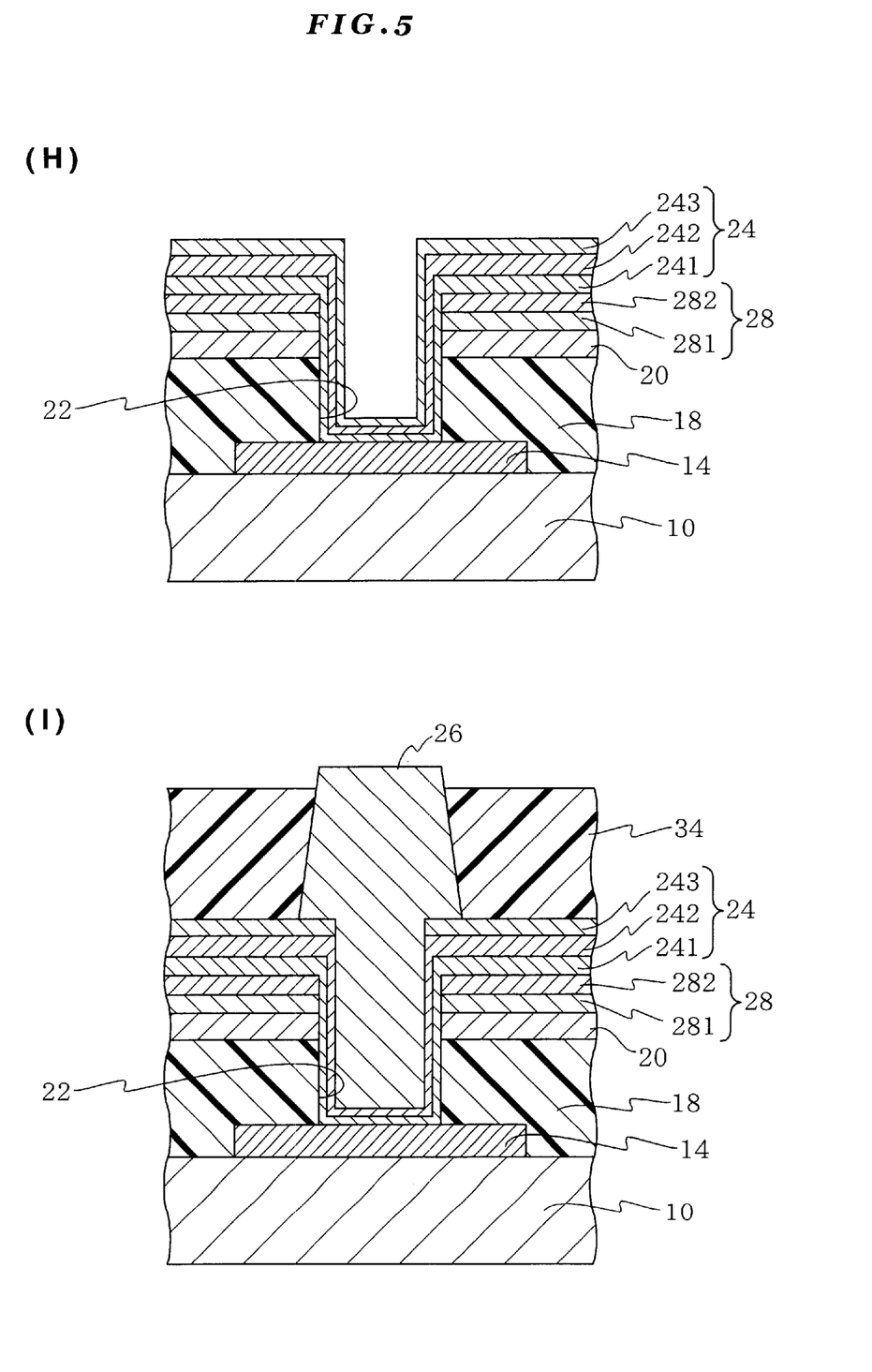
FIG. 5H and FIG. 5I are cross sectional views of film formation steps in this order for forming the organic insulation film according to the first embodiment of the present invention.
Figure 6:
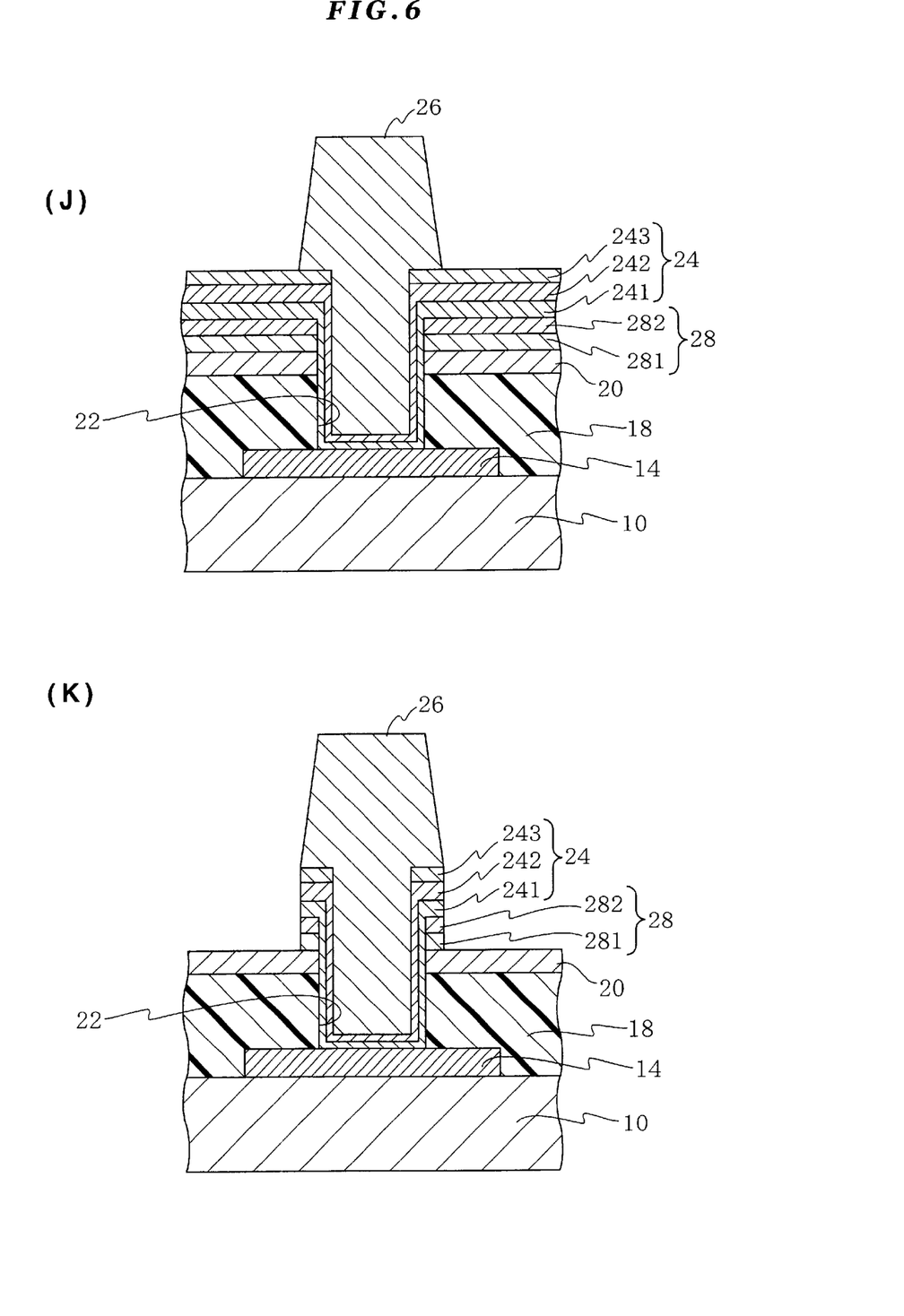
FIG. 6J and FIG. 6K are cross sectional views of film formation steps in this order for forming the organic insulation film according to the first embodiment of the present invention.

The first half of the processing is identical to the processing of FIG. 2 to FIG. 4 of the first embodiment except for that the protection film 20 is made from $SiO_2$, and explation on the first half is omitted. The protection film 20 made from $SiO_2$ has an almost identical function as the silicone nitride.

As shown in FIG. 7H, after the through hole 22 is formed, a Ti film (50 Angstrom) 401, a Pt film (500 Angstrom) 402, a Au film (1000 Angstrom) 403, and Ti film (500 Angstrom) 404 are successively formed in this order by way of sputtering, thus forming a wiring metal 40.

Subsequently, as shown in FIG. 7I, a photo-resist 42 is used for patterning for plating.

Subsequently, as shown in FIG. 8J, the wiring metal is processed by ion milling to form a lower layer wiring 44.

At last, as shown in FIG. 8K, the photo-resist 42 is removed using an organic solvent such as methyl ethyl ketone, thus completing the lower layer wiring 44.

Subsequently, in order to form a multi-layered wiring, an inter-layer insulation film is formed from the benzocyclobutene on the lower layer wiring 44, and the procedure of FIG. 2 to FIG. 6 is repeated for forming an upper layer wiring.

In the organic insulation film formation method according to the present invention, a metal film is used as a mask for etching the protection film and the organic insulation film. Accordingly the protection film need not has a large thickness which is required for a mask. That is, the protection film may have a sufficiently small thickness. Consequently, it is possible to prevent cracks and other deterioration of the organic insulation film due to a large thickness of the protection film.

Moreover, the organic insulation film may be formed with an arbitrary thickness regardless of the protection film. Thus, the organic insulation film may have a large thickness regardless of the protection film. Accordingly, the organic insulation film can exhibit sufficient inter-layer insulation capability.

Furthermore, the protection film and the organic insulation film are etched using a metal film as a mask. That is, the protection film is covered by a metal film during etching. This can prevent irregularities of the protection film thickness which may be caused in the etching step.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-227964 (Filed on Aug. $12^{th}$, 1998) including specification, claims, drawings and summary are incorporated herein by reference in its entirety.

What is claimed is:

1. An organic insulation film formation method comprising the steps of:

successively forming an organic insulation film, a protection film, and a metal film in this order on a substrate, said metal film being a multi-layer metal film having at least a top layer and a bottom layer;

forming a patterned photo-resist on the multi-layer metal film;

etching the metal film using the photo-resist as a mask;

etching the protection film and the organic insulation film using a remaining portion of the multi-layer metal film as a mask; and removing a portion of the remaining multi-layer metal film in order to expose a corresponding portion of the protection film thereunder.

2. An organic insulation film formation method as claimed in claim 1, wherein when etching the protection film and the organic insulation film using the metal film as the mask, the etching rate of the metal film is equal to or below $\frac{1}{10}$ of the etching rate of the protection film and the organic insulation film.

3. An organic insulation film formation method as claimed in claim 1, wherein the organic insulation film is made from benzocyclobutene, the protection film is made from a silicon compound, and the multi-layer metal film is made from at least one of platinum, gold and an alloy containing at least one of platinum and gold, disposed as a top layer upon a titanium layer forming the bottom metal layer.

4. An organic insulation film formation method as claimed in claim 2, wherein the organic insulation film is made from benzocyclobutene, the protection film is made from a silicon compound, and the metal film is made from platinum or gold or any alloy containing at least one of platinum and gold.

5. An organic insulation film formation method as claimed in claim 1, wherein the organic insulation film is made from benzocyclobutene, the protection film is made from at least one of silicon nitride and silicon oxide, and the multi-layer metal film is made from at least one of platinum and gold, disposed upon a titanium layer forming the bottom metal layer.

6. An organic insulation film formation method as claimed in claim 2, wherein the organic insulation film is made from benzocyclobutene, the protection film is made from silicon nitride or silicon oxide, and the metal film is made from platinum or gold.

7. An organic insulation film formation method as claimed in claim 1, wherein the organic insulation film is made from benzocyclobutene, the protection film is made from silicon nitride or silicon oxide, and the metal film is made from titanium and platinum or gold which are layered in this order.

8. An organic insulation film formation method as claimed in claim 2, wherein the organic insulation film is made from benzocyclobutene, the protection film is made from silicon nitride or silicon oxide, and the metal film is made from titanium and platinum or gold which are layered in this order.

9. An organic insulation film formation method as claimed in one of claims 1–4, wherein etching of the metal film using the photo-resist as a mask is performed by using ion milling.

10. An organic insulation film formation method as claimed in one of claims 1–4, wherein the etching of the protection film and the organic insulation film using the metal film as a mask is performed as a dry etching using a mixed gas plasma of oxygen and fluorine.

11. The method of claim 1, further comprising:
forming an ohmic electrode as at least one of a source electrode and a drain electrode.

12. The method of claim 11, wherein said forming said ohmic electrode further comprises:
performing thermal processing for one minute at 400 degrees centigrade in a hydrogen atmosphere.

13. The method of claim 12, further comprising:
forming said organic insulation layer on said ohmic electrode.

14. The method of claim 13, wherein said organic insulation layer is benzocyclobutene having a thickness of about 2 micrometers.

15. The method of claim 1, wherein said multi-layer metal film includes a top layer of platinum and a second lower layer of titanium.

16. An organic insulation film formation method comprising the steps of:
successively forming an organic insulation film, a protection film, and a metal film in this order on a substrate, said metal film being a multi-layer metal film having at least a top layer and a bottom layer;
forming a patterned photo-resist on the multi-layer metal film;
etching the metal film using the photo-resist as a mask; and
etching the protection film and the organic insulation film using a remaining portion of the multi-layer metal film as a mask,
wherein said multi-layer metal film includes a top layer of platinum and a second lower layer of titanium; and
wherein said top layer of platinum has a thickness of approximately 200 Angstroms, and said second lower layer of titanium has a thickness of approximately 100 Angstroms.

17. An organic insulation film formation method comprising the steps of:
successively forming an organic insulation film, a protection film, and a metal film in this order on a substrate, said metal film being a multi-layer metal film;
forming a patterned photo-resist on the metal film;
etching the metal film using the photo-resist as a mask; and
etching the protection film and the organic insulation film using a top metal layer of any remaining metal film as a mask;
wherein said multi-layer metal film includes a top layer of platinum and a second lower layer of titanium;
wherein said top layer of platinum has a thickness of approximately 200 Angstroms, and said second lower layer of titanium has a thickness of approximately 100 Angstroms; further comprising:
forming a composite plating path on a wall of a through hole in the organic insulation film forming a bottom of said ohmic electrode, wherein portions of said plating path are formed on top of said multi-layer metal film;
adding a second layer of photoresist for patterning for plating; and
performing gold plating to form wiring.

18. The method of claim 17, wherein said composite plating path includes a titanium, platinum and gold.

19. An organic insulation film formation method comprising the steps of:
successively forming an organic insulation film, a protection film, and a first metal film in this order on a substrate;
forming a patterned photo-resist on the first metal film;
etching the first metal film using the photo-resist as a mask;
etching the protection film and the organic insulation film using a remaining portion of the first metal film as a mask;
forming a second metal film over the remaining portion of the first metal film; and
forming a wiring metal film by patterning the remaining portion of the first metal film and the second metal film.

20. The organic insulation film formation method of claim 19, wherein said first metal film, said second metal film and said wiring metal film include metals selected from the group consisting of: titanium (Ti), platinum (Pt) and gold (Au).

21. The organic insulation film formation method of claim 19, wherein said patterning of the first metal film and the second metal film is performed by applying a photo-resist layer.

22. The organic insulation film formation method of claim 19, further comprising:
removing portions of the first metal film and the second metal film in order to expose a corresponding portion of the protection film thereunder.

23. The organic insulation film formation method of claim 19, further comprising:
forming a third metal film over the second metal film;
forming a wiring metal film by patterning the remaining portion of the first metal, film, the second metal film, and the third metal film.

24. The organic insulation film formation method of claim 19, wherein said wiring metal film is a lower level wiring metal film, and wherein the method further comprises:
forming an interlayer insulation film on said lower level wiring metal film; and
repeating the forming, patterning, and etching steps to form an upper level wiring metal film.

25. A wiring formation method comprising:
successively forming an organic insulation film and a metal film, which provide an etching selectivity, in this order on a substrate;
etching the metal film using a patterned photo-resist as a mask;
forming an opening on the organic insulation film by etching the organic insulation film using the metal film as a mask;
forming a wiring metal film in the opening of the organic insulation film and on the metal film; and
removing a portion of the wiring metal film not used in forming a wiring and also removing a corresponding portion of the metal film.

26. The wiring formation method of claim 25, further comprising:
forming a plating path metal film on an inner wall of the opening of the organic insulation film and on the metal film as the wiring metal film;
forming a wiring by plating on the plating path metal film and in the opening of the organic insulation film using a patterned photo-resist film; and after removing the patterned photo-resist film, removing a portion of the plating path metal film not used as a plated wiring and also removing a corresponding portion of the metal film by etching.

27. The wiring formation method of claim 25, wherein the metal film used as the mask is a first metal film, and the method further comprising:
   forming a second metal film as the wiring metal film on an inner wall of the opening of the organic insulation film and on the first metal film;
   etching away a portion of the wiring metal film not included in the wiring and a corresponding portion of the first metal film using a patterned photo-resist film; and
   removing the patterned photo-resist film.

28. The wiring formation method of claim 25, wherein a protection film is placed between the organic insulation film and the metal film.

29. The wiring formation method of claim 25, wherein, when etching the organic insulation film using the metal film as a mask, the etching rate of the metal film is not more than one-tenth of an etching rate of the organic insulation film.

30. The wiring formation method of claim 28, wherein, the organic insulation film is made from benzocyclobutene, the protection film is made from a silicone compound, and the metal film is made from one of: platinum, gold and an alloy containing at least one: of platinum and gold.

31. The wiring formation method of claim 28, wherein the organic insulation film is made from benzocyclobutene, the protection film is made from one of: silicon nitride and silicon oxide, and the metal film is made from one of: platinum and gold.

32. The wiring formation method of claim 28, wherein the organic insulation film is made from benzocyclobutene, the protection film is made from one of: silicon nitride and silicone oxide, and the metal film is made from titanium and one of: platinum and gold layered in this order.

33. The wiring formation method of claim 25, wherein said etching of the metal film using the photo-resist as a mask is performed by using ion milling.

34. The wiring formation method of claim 28, wherein, when etching the metal film, the protection film is also etched, and the etching of the metal film and the protection film using the metal film as a mask is performed as a dry etching using a mixed gas plasma of oxygen and fluorine.

* * * * *